(12) United States Patent
Akeno (10) Patent No.: US 7,528,393 B2
(45) Date of Patent: May 5, 2009

(54) CHARGED PARTICLE BEAM PROCESSING APPARATUS

(75) Inventor: Kiminobu Akeno, Yokohama (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 182 days.

(21) Appl. No.: 11/235,411

(22) Filed: Sep. 26, 2005

(65) Prior Publication Data

US 2006/0076514 A1    Apr. 13, 2006

(30) Foreign Application Priority Data

Sep. 27, 2004    (JP) .............................. 2004-280742

(51) Int. Cl.
*A61N 5/00*    (2006.01)
(52) U.S. Cl. .............................. 250/492.22; 250/491.1; 250/492.2; 250/398; 250/400; 355/53; 355/55
(58) Field of Classification Search ............ 250/492.21, 250/492.2, 492.22, 492.1, 491.1, 398, 400; 355/53, 55
See application file for complete search history.

(56) References Cited

U.S. PATENT DOCUMENTS

| | | | | |
|---|---|---|---|---|
| 4,748,333 A | * | 5/1988 | Mizutani et al. | 250/559.07 |
| 6,323,935 B1 | * | 11/2001 | Ebihara et al. | 355/53 |
| 6,753,518 B2 | * | 6/2004 | Watanabe et al. | 250/201.3 |
| 6,813,000 B1 | * | 11/2004 | Nishi | 355/53 |
| 2003/0128348 A1 | * | 7/2003 | Nishi | 355/53 |
| 2004/0008331 A1 | * | 1/2004 | Cox et al. | 355/53 |
| 2005/0128451 A1 | * | 6/2005 | Mitsui et al. | 355/53 |
| 2005/0206865 A1 | * | 9/2005 | Kwan et al. | 355/53 |

FOREIGN PATENT DOCUMENTS

| | | |
|---|---|---|
| JP | 6-55477 | 3/1994 |
| JP | 2002-280287 | 9/2002 |
| JP | 2003-282427 | 10/2003 |

OTHER PUBLICATIONS

Office Action issued Jul. 31, 2007 by the Japanese Patent Office for the corresponding Application No. 2004-280742 w/ translation.

* cited by examiner

*Primary Examiner*—Jack I Berman
*Assistant Examiner*—Michael J Logie
(74) *Attorney, Agent, or Firm*—Ohlandt, Greeley, Ruggiero & Perle, L.L.P.

(57) ABSTRACT

A charged particle beam processing apparatus includes a sample chamber to process a substrate including side faces by a charged particle beam, a movable stage in the sample chamber, the stage including a place on which the substrate is to be mounted, a height and position acquiring unit to acquire a height of the substrate on the stage by irradiating a laser beam onto the substrate on the stage and using the laser beam reflected from the substrate and to acquire positions of at least two adjacent side faces among the side faces based on the acquired height, and a calculating unit to calculate a position of center of gravity of the substrate on the stage and a rotation angle as to a rotary axis vertical to the place on which the substrate is to be mounted based on the positions of the at least two adjacent side faces.

8 Claims, 6 Drawing Sheets

CHARGED PARTICLE BEAM PROCESSING APPARATUS

CROSS-REFERENCE TO RELATED APPLICATIONS

This application is based upon and claims the benefit of priority from prior Japanese Patent Application No. 2004-280742, filed Sep. 27, 2004, the entire contents of which are incorporated herein by reference.

BACKGROUND OF THE INVENTION

1. Field of the Invention

The present invention relates to a charged particle beam processing apparatus for drawing a pattern such as an LSI on a substrate by an electron beam and for applying processing to a surface of the substrate by a convergent ion beam.

2. Description of the Related Art

In recent years, there has been a further growing demand for improvement of the integrity and precision of an LSI. There has been very stringent the specification of a line width and dimensional precision of a pattern to be drawn on a substrate such as a mask (or reticule) for use in manufacture of the LSI.

Therefore, an expensive mask drawing apparatus having its highly advanced performance is required to manufacture a highly advanced mask. Further, a mask drawing time is increased due to the improvement of the integrity and downsizing, and thus, a mask manufacturing cost is increasing higher. In addition, a number of steps including a mask drawing step followed by a developing step, an etching step, an inspection step, a correction step and the like are required for manufacturing the mask. Considering the costs of these steps, it is predicted that the mask manufacturing cost becomes huge.

Therefore, an utmost effort for improving the yield of mask manufacturing is made in order to reduce an increase of the mask manufacturing cost to its required minimum.

The largest factor of lowering the yield of mask manufacturing is a defect of a pattern of a manufactured mask, and the largest cause of this defect is a particle (foreign object) on a mask substrate such as dust, damage, or dirt.

In particular, in the case where a particle exists on a mask substrate before drawn, and if the particle is present in an exposure region, a portion at which the particle has existed surely remains as a defect. The defect is detected in the inspection step that follows the drawing step, the developing step, and the etching step, and the correction or discarding process is carried out. Therefore, the key to improvement of the yield is how to surely detect a particle which causes a defect before drawing and discard the mask substrate having the particle.

Thus, each manufacture makes an utmost effort for how to prevent a particle such as dust from adhering to mask blanks before drawn (hereinafter, referred to as a "substrate").

When drawing a pattern on a substrate, it is necessary to set the substrate in a drawing apparatus and to transport the substrate into a sample chamber. However, at this stage, there is a very high possibility of dust or dirt newly adhering onto the substrate. In particular, there exist a variety of opportunities of adhering of a particle such as adhering of dust which occurs at the time of a shock or vibration on the way of transporting the substrate or at the time of transporting the substrate from an atmospheric environment to a vacuum environment.

Among them, the most important is that it is unavoidable that the substrate and a structure on a stage in the sample chamber come into contact with each other when the substrate is installed on the stage. In addition, it is general to press the substrate against a positional reference (an object to be pressed) on the stage to thereby determine a drawing position of the substrate on the stage. However, at this time as well, a positioning mechanism comes into contact with the substrate, whereby there is a high possibility that a dust occurs.

Therefore, in recent years, there has been proposed a method for merely placing the substrate on a substrate holding unit on the stage without pressing the substrate against the positional reference when the substrate is installed on the stage in the sample chamber. In this case, no positioning is carried out on the stage, and thus, there is a danger that a position of the substrate on the stage and a position of a pattern to be drawn are shifted from each other.

If a position shift of the drawing pattern on the substrate occurs, a large amount of time is required for pre-alignment of detecting a position of a pattern formed on the substrate by means of a stepper using the substrate or the like, or detection may be impossible.

Thus, in order to detect the position of the substrate on the stage, there has been thought a method for detecting the position and a rotation angle of the substrate, correcting a drawing pattern, and correcting a setup position of the substrate by an image processing technique using a CCD camera or the like (Jpn. Pat. Appln. KOKAI Publication No. 2002-280287).

However, in the case of using the image processing technique using the CCD camera or the like, there is a problem that there is a high possibility of incorrect recognition for the different optical characteristics of substrate surfaces. The different optical characteristics is cased by a surface condition of substrate under detection object. The surface condition of substrate is determined by for example a method for applying resist or, a formed state of a light shielding film such as a Cr film. The different optical characteristics is further cased by type of the substrate (for example, a Levenson mask or a half tone mask or like).

In addition, when an attempt is made to precisely detect the position of the substrate, a CCD camera must be installed near an electron optical mirror cylinder of the sample chamber, so that there is a danger that drawing precision is adversely affected by an electromagnetic wave (noise) which leaks from the CCD camera.

Moreover, in order to detect a position of a substrate by carrying out image processing using the CCD camera or the like, there is a need for complicated processing operations such as detecting an image of a specific mark and capturing an image of the vicinity of an side face of the substrate in order to calibrate a positional relationship with a CCD image on the stage; carrying out pattern recognition from an image of an side face or the like; and detecting a position and a rotation angle of the side face.

Further, there is a need for additional illumination means for illuminating the substrate in a vacuum sample chamber in order to obtain an optical image, and a drawing apparatus itself and a detecting process become complicated.

As described above, in the prior art, when the substrate is installed on the stage in the sample chamber of the charged particle beam drawing apparatus, there is a possibility that a position shift of a drawing pattern on the substrate occurs if the setup position of the substrate is shifted. When the positional reference (the object to be pressed) or the like is used in order to prevent the shifting, there is a danger that particles generate. In addition, when using the image processing technique using the CCD camera or the like, a noise which impairs the drawing precision is generated or the CCD camera, its optical system and illumination system make the apparatus complicated. Moreover, there is a problem that a variety of works such as image and coordinate calibration are required.

BRIEF SUMMARY OF THE INVENTION

A charged particle beam processing apparatus according to an aspect of the present invention comprises a sample chamber configured to process a substrate including a plurality of side faces by a charged particle beam; a movable stage provided in the sample chamber, the stage including a place on which the substrate is to be mounted; a height and position acquiring unit configured to acquire a height of the substrate on the stage by irradiating a laser beam onto the substrate mounted on the stage and using the laser beam reflected from the substrate and configured to acquire positions of at least two adjacent side faces among the plurality of side faces of the substrate mounted on the stage based on the acquired height of the substrate; and a calculating unit configured to calculate a position of center of gravity of the substrate mounted on the stage and a rotation angle as to a rotary axis vertical to the place on which the substrate is to be mounted based on the positions of the at least two adjacent side faces.

DETAILED DESCRIPTION OF THE INVENTION

Hereinafter, embodiments of the present invention will be described with reference to the accompanying drawings.

Figure 1:
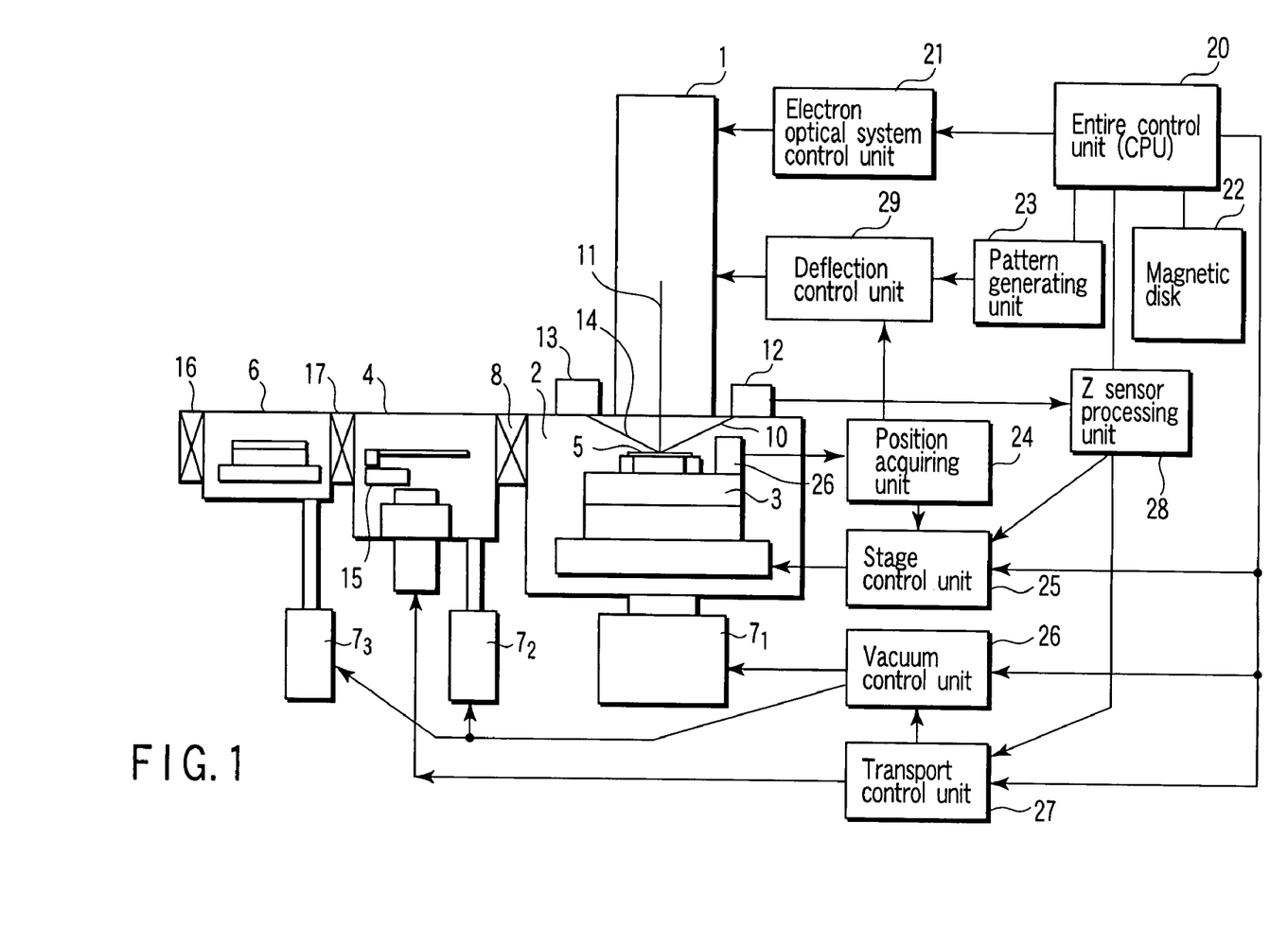
FIG. 1 is a schematic diagram showing a configuration of a charged particle beam drawing apparatus according to an embodiment of the present invention.
Figure 2:
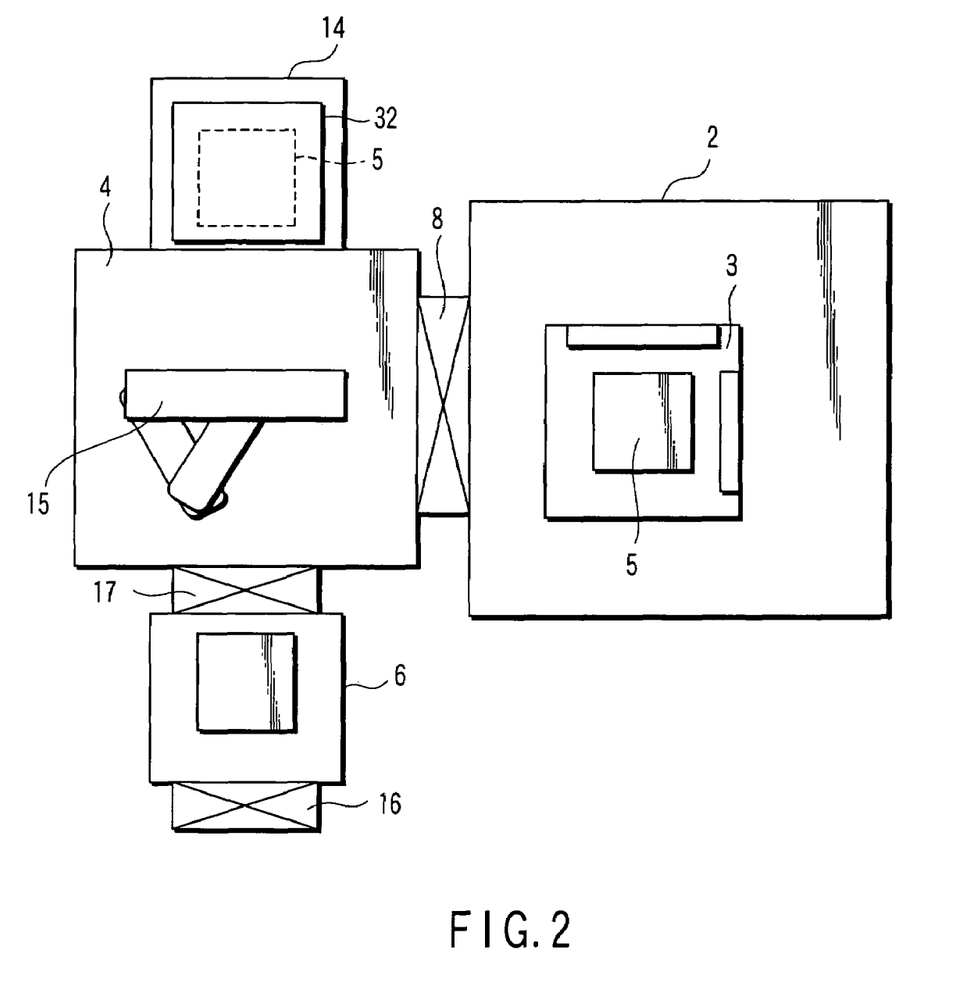
FIG. 2 is a plan view showing a layout of the charged particle beam drawing apparatus according to the embodiment.

FIG. 1 is a schematic diagram showing a configuration of a charged particle beam drawing apparatus according to an embodiment of the invention. FIG. 2 is a plan view showing a layout of the charged particle beam drawing apparatus shown in FIG. 1.

First, a description will be given with respect to a configuration, an operation and the like of the drawing apparatus according to the present embodiment.

The drawing apparatus is an apparatus which irradiates a charged particle beam onto a substrate and draws a pattern such as an integrated circuit on the substrate. Hereinafter, the term drawing denotes that a pattern is formed on a substrate by means of charged particle beam irradiation. The following description will be given with respect to a case of the drawing apparatus (electron beam drawing apparatus) using an electron beam as a charged particle beam.

The drawing apparatus of the present embodiment comprises a sample chamber 2 for drawing a pattern on a substrate by means of an electron beam 11; a movable stage 3 provided in the sample chamber 2, and including a mount place (face) on which a substrate 5 is to be mounted; an electron optical system 1 to irradiate the electron beam 11 onto the substrate 5 mounted on the stage 3, and connected to the sample chamber 2; a transport chamber 4 to transport the substrate 5 by using a transport robot 15 or the like, and connected to the sample chamber 2 via a gate valve 8; a load lock chamber 6 to produce an atmospheric environment or a vacuum environment in which the substrate 5 is to be placed and connected to the transport chamber 4 via a gate valve 17; and a variety of control units 21, 25, 26, and 27 for controlling these constituent elements.

A preparatory chamber 14 to temporarily contain the substrate 5 is provided in the transport chamber 4 as shown in FIG. 2. A gate valve 16 is provided at the atmospheric side of the load lock chamber 6. The electron optical system 1 is controlled by the electron optical system control unit 21. The stage 3 is controlled by the stage control unit 25. The transport robot 15 in the transport chamber 4 is controlled by the transport control unit 27. Vacuum pumps $7_1$, $7_2$, and $7_3$ are provided in the sample chamber 2, the transport chamber 4, and the load lock chamber 6, respectively. These vacuum pumps $7_1$, $7_2$, and $7_3$ are controlled by the vacuum control unit 26. The electron optical system control unit 21, the vacuum control unit 26, and the transport control unit 27 follow a command (instruction) from an entire control unit (CPU) 20.

Further, the drawing apparatus of the present embodiment comprises a substrate height detecting mechanism to detect a height of a surface of the substrate 5. A light projecting unit 12 and a light receiving unit 13 of the substrate height detecting mechanism are installed on the sample chamber 2. From the light projecting unit 12, a laser beam 10 focused by an optical system through a vacuum window (not shown) is irradiated in the vicinity of a drawing point of the substrate 5, and its reflection beam is made incident to the light receiving unit 13. The height of the substrate 5 is detected by measuring a position of a reflection beam $10r$ made incident to the light receiving unit 13. Hereinafter, the substrate height detecting mechanism is referred to as a Z sensor for the purpose of simplification.

Now, a processing operation for carrying out drawing on the substrate 5 will be briefly described here.

For carrying out drawing, first, the gate valve 16 at the atmospheric side of the load lock chamber 6 is opened, and the substrate 5 is transported into the load lock chamber 6.

Next, with the gate valves 16 and 17 closed, the inside of the load lock chamber 6 is vacuumed by the vacuum pump $7_3$ or the like. After vacuuming has finished, the gate valve 17 is opened, and the substrate 5 in the load lock chamber 6 is transported into the transport chamber 4 by using the transport robot 15 or the like.

Next, the substrate 5 in the transport chamber 4 is transported into the preparatory chamber 14, and vacuum exposure is carried out for the purpose of positioning of the substrate 5 in the preparatory chamber 14 or temperature fixing of the substrate 5.

Next, the gate valve 8 is opened, the substrate 5 is transported into the sample chamber 2 by the transport robot 15 or the like, the substrate 5 is further mounted on the stage 3, thereafter, the gate valve 8 is closed.

Next, processing proceeds to the step of irradiating the electron beam 11 onto the substrate 5 mounted on the stage 3 and drawing a pattern. However, it should be noted that the substrate 5 is not always installed at its normal position during the step.

Here, in the conventional drawing apparatus, after the substrate 5 has been installed on the stage 3, the substrate 5 is pressed against the object to be pressed so as to be corrected to its normal position by the transport robot 15 or a pressing mechanism (not shown) on the stage 3.

However, if such an operation is made, the pressing operation generates particles, and a particle (foreign object) is loaded on the substrate 5, thereby, a defect occurs in a drawing pattern. In order to avoid this, the drawing apparatus of the present embodiment presumes that the substrate 5 is installed on the stage 3 without being pressed against the object to be pressed or the like.

And now, it is necessary to first check the height of the substrate 5 without carrying out drawing immediately after the installation. This is because the height (focal point range) of the drawing point of the electron optical system 1 shown in FIG. 1 is fixed, and the drawing precision is impaired if a drawing face of the substrate 5 is not present in the focal point range. Thus, the stage 3 is moved, the height of the surface of the substrate 5 is measured by the Z sensor (light projecting unit 12, light receiving unit 13, and Z sensor processing unit 28), and the drawing condition is changed to carry out drawing with high precision.

In an actual drawing operation, first, the stage control unit 25 moves the stage 3 having the substrate 5 mounted thereon to a movement start point for the purpose of the drawing operation, in accordance with a command (instruction) from the entire control unit (CPU) 20. Next, the entire control unit 20 divides pattern data stored in a magnetic disk 22 into figures to be actually drawn, and transfers the figures to a pattern generating unit 23 for calculating its drawing position (position data).

At a time when the above preparation has been made, the entire control unit 20 instructs the stage control unit 25 to make a stage operation and causes the control unit to move the substrate 5. The position of the substrate 5 is detected by a laser mirror 26 or the like on the stage 3, and its position is obtained from a position acquiring unit 24, thereby, a deflection control unit 29 deflects the electron beam 11 in the electron optical system 1 based on the figures and position data transferred from the pattern generating unit 23, irradiates the electron beam 11 onto a desired position on the substrate 5, and carries out drawing.

After drawing has finished, the gate valve 8 is opened again, and the substrate 5 is taken out from the inside of the sample chamber 2 by the transport robot 15. After the substrate 5 has been transported into the load lock chamber 6, the inside of the load lock chamber 6 is made atmospheric, the gate valve 16 is opened, and the substrate 5 is transported to the outside.

Next, a description will be given with respect to the Z sensor (substrate height detecting mechanism) of the drawing apparatus of the present embodiment.

Figure 3A:
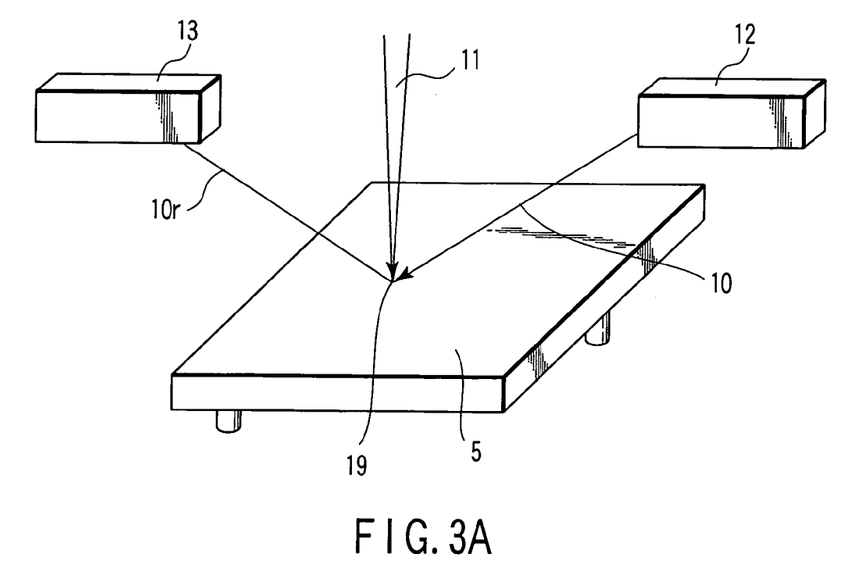
FIGS. 3A and 3B are views for explaining a Z sensor of the charged particle beam drawing apparatus according to the embodiment.
Figure 3B:
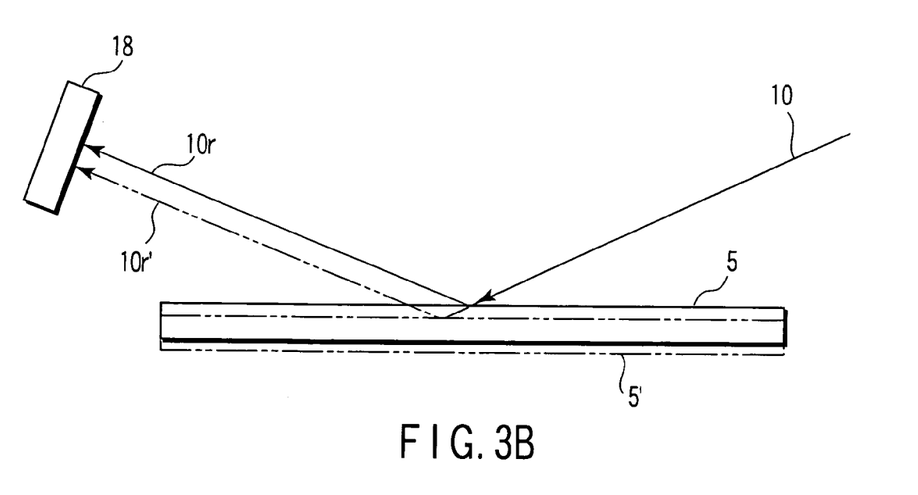

FIGS. 3A and 3B are views for explaining the Z sensor of the present embodiment. FIG. 3A is a perspective view showing a spatial configuration, and FIG. 3B is a sectional view showing a principle of the measurement.

As shown in FIG. 3A, in the present embodiment, an optical system inside of the light projecting unit 12 is adjusted such that the laser beam 10 emitted from the light projecting unit 12 is focused near the drawing point 19 of the electron beam 11. The laser beam 10 is set so as to be a sufficiently small spot in the vicinity of the drawing point 19, so that a small level of height difference on the substrate 5 can be acquired. The reflection beam 10r reflected at the drawing point 19 is made incident to the light receiving unit 13, and the height is detected at the inside of the light receiving unit 13.

While the present embodiment shows an example in which the laser beam 10 is focused in the vicinity of the drawing point 19 so as to be a spot, it is additionally noted that detecting the height in the vicinity of the drawing point 19 is not always mandatory in the present embodiment, and that the advantageous effect can be attained as long as the height can be detected throughout the full face of the substrate 5.

As shown in FIG. 3B, the present embodiment uses a Z sensor of an optical lever system using an obliquely incident laser beam. Thus, in the case where the height of the substrate 5 indicated by the solid line is changed to a position of a substrate 5' indicated by the double dotted chain line, a spot position of the laser beam 10 moves. In response to this movement, the laser beam 10 reflected on the substrate changes from the reflection beam 10r indicated by the solid line to a reflection beam 10r' indicated by the double dotted chain line. As a result, if the height of the substrate 5 changes, a light incidence position of the reflection beam on a detector 18 in the light receiving unit 13 changes. Therefore, the height of the substrate 5 is determined from the light incidence position of the reflection beam on the detector 18.

The present embodiment uses the Z sensor of the optical lever system for making the laser beam 10 obliquely incident. As described previously, however, it is a matter of course that similar advantageous effect can be attained as long as the principles of measurement and detection are used to enable measurement of the height relevant to the full face of the substrate and enable detection of the height at a sufficiently small spot.

For example, in the Z sensor using a laser confocal point technique, it is impossible to bring a spot into the vicinity of a drawing point from an aspect of a layout. However, the Z sensor can be sufficiently utilized as long as a stage movement range exists such that the full face of the substrate 5 can be scanned. It is additionally noted that the advantageous effect of the present embodiment can be sufficiently attained as long as it is possible to detect the height of the substrate 5 relevant to its full face similarly even if a knife edge technique is used.

Hereinafter, the present embodiment will be described by way of example of the Z sensor of the optical lever system.

Figure 4A:
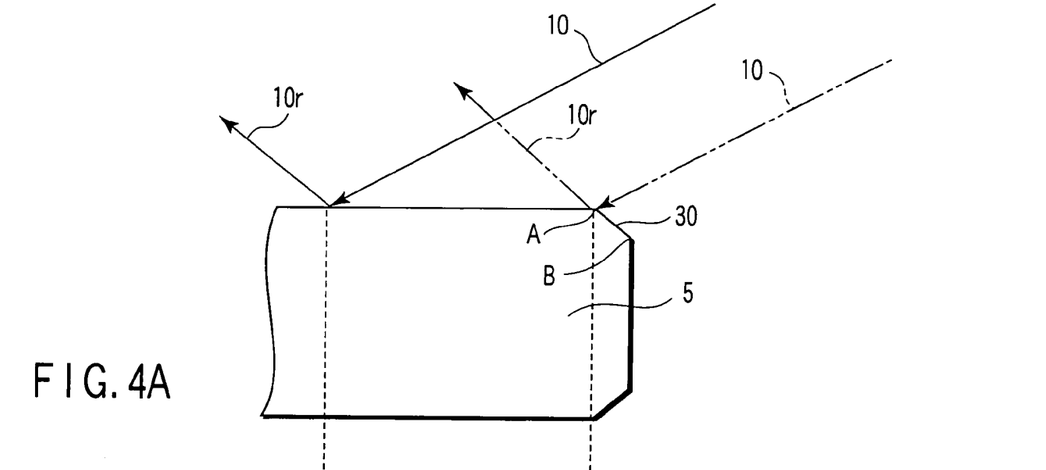
FIGS. 4A to 4C are views showing a detection state of a Z sensor in the vicinity of an side face of a substrate.
Figure 4B:
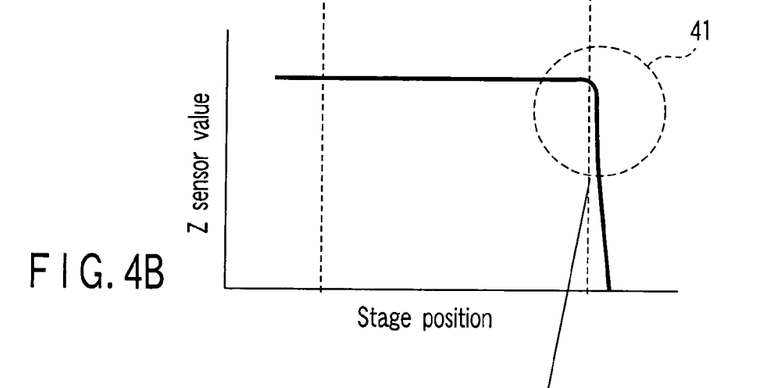
Figure 4C:
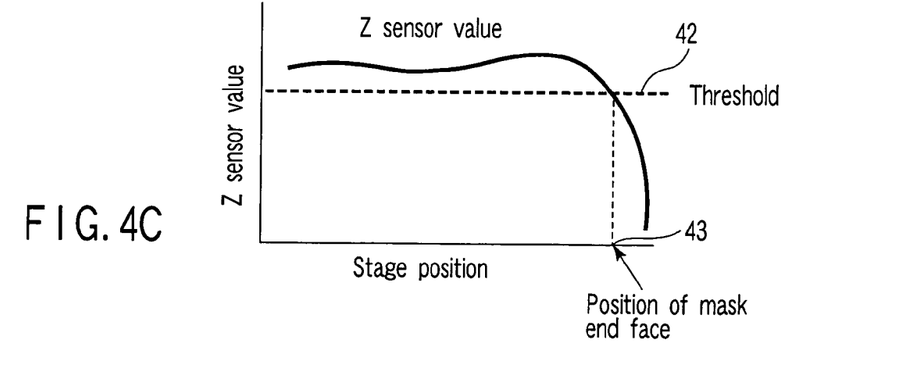

FIGS. 4A to 4C are views showing a detection state of the Z sensor in the vicinity of an side surface (end face) of the substrate 5. FIG. 4A is a schematic view showing Z sensor measurement in the vicinity of the side face of the substrate, FIG. 4B is a view showing a relationship between a Z sensor measurement value and a stage position when a stage has been moved in the side face direction, and FIG. 4C is a view showing a detail on a change of the Z sensor value in the side face vicinity 41 of the substrate 5 in FIG. 4B.

As shown in FIG. 4A, a C chamfer section 30 is present in vicinity of the side face of the substrate 5. When a spot of the laser beam 10 (double dotted chain line) reaches this portion, the measurement value is rapidly reduced as shown in FIG. 4B.

Therefore, as shown in FIG. 4C, a threshold 42 is set relevant to the Z sensor value, and a stage position coordinate 43 obtained when the Z sensor value is lower than the threshold 42 is taken out, thereby making it possible to substantially acquire an side face position coordinate of the substrate 5.

So, when measuring the height of the surface of the substrate 5, the stage 3 is moved at a low speed in the substrate side face direction, and the Z sensor measurement value is recorded while acquiring the coordinate data on the stage position. Then, the stage position coordinate 43 obtained when the Z sensor value is lower than the threshold 42 is sampled from time series data on the stage position and Z sensor measurement value. This makes it possible to easily acquire an side face (start portion of C chamber) and to calculate a position of center of gravity of the substrate 5 on the stage and a rotation angle as to a rotary axis vertical to a place (face) of stage on which the substrate is to be mounted based on the position data.

This processing operation will be described with reference to FIG. 1.

Prior to drawing, the entire control unit 20 gives a command to the stage control unit 25, and causes the stage control unit 25 to move the stage 3 at a low speed in the side face direction of the substrate 5. At this time, the stage 3 is moved while the position coordinate of the stage 3 obtained from the position acquiring unit 24 and time are stored in a memory by the stage control unit 25 or entire control unit 20. At the same time, while the height of the substrate 5, namely, the Z sensor value is measured by the Z sensor processing unit 28, the associated data is read by the stage control unit 25 or entire control unit 20 together with the position coordinate data on the preceding stage 3. Then, the entire control unit 20 reads time data and position coordinate data on a moment at which the Z sensor value is lower than the threshold. By using this value, a position coordinate is defined for one of the four side faces of the substrate 5.

After the measurement has finished, the entire control unit 20 stops the stage 3, operates the stage 3 for the purpose of next side face position acquisition, and repeats the processing operation described previously. By repeating the above processing operation, the position coordinate (end position information) on the four side faces of the substrate 5 is acquired.

The above description has been made with respect to a method of operating the stage 3 while monitoring the Z sensor value in real time. However, it is also possible to move the stage 3 at a predetermined stoke, namely, move the stage 3 in a predetermined step, record all of the movement time, stage position coordinates, and Z sensor values, analyze the data after operation has finished, and obtain an side face position coordinate.

Next, a description will be given with respect to a method for obtaining the position of center of gravity and the rotation angle of the substrate 5 based on the acquired side face position information.

Figure 5:
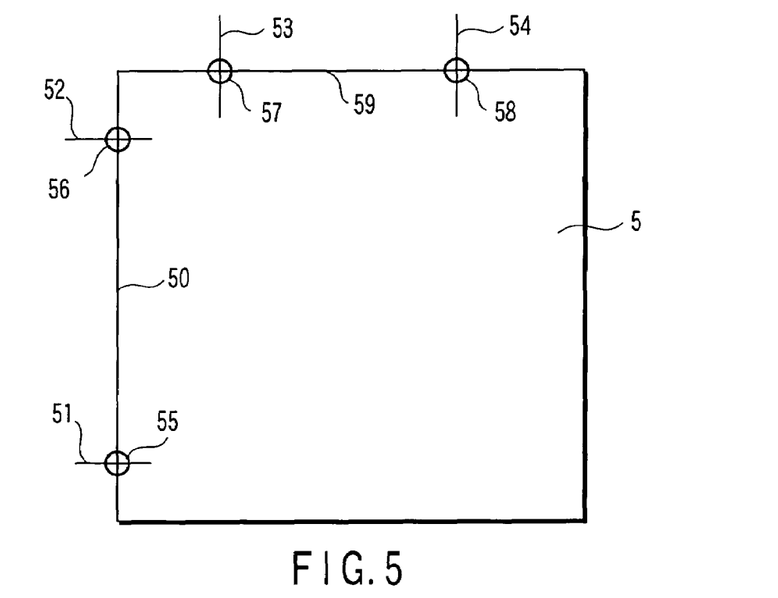
FIG. 5 is a view for explaining a method for detecting a position of center of gravity and a rotation angle of the substrate according to the embodiment.

FIG. 5 is a view for explaining an example of the method for acquiring the position of center of gravity and rotation angle of the substrate 5. In FIG. 5, the C chamfer section 30 shown in FIG. 4A is indicated by a rectangular corner portion shown in FIG. 4A for the purpose of simplification. Here, a description will be given with respect to a case of acquiring an side face position which corresponds to A or B of the C chamfer section 30 shown in FIG. 4A.

This acquiring method acquires side face positions with respect to two adjacent side faces 50 and 59 of the substrate 5. And the acquiring method is a method for a case where the size of the substrate 5 is always constant or the center of gravity is present at a predetermined position from the side faces 50 and 59. Namely, the acquisition method assumes a case in which, when acquiring a plurality of substrates 5, the center of gravity of each of the plurality of these substrates 5 is identical.

First, the stage 3 is moved similarly with respect to scanning lines 51 and 52 for the purpose of position acquisition of the side face 50, and side face positions 55 and 56 of the substrate 5 are acquired in accordance with the method described previously. A line connecting the side face positions 55 and 56 correspond to the side face 50.

Next, the stage 3 is moved similarly with respect to scanning lines 53 and 54 for the purpose of position acquisition of the side face 59, and side face positions 57 and 58 of the substrate 5 are acquired in accordance with the method described previously. A line connecting the side face positions 57 and 58 correspond to the side face 59.

Subsequently, the position of center of gravity and rotation angle of the substrate 5 are obtained by using the thus acquired side face positions 55, 56, 57, and 58. In the case of FIG. 5, it is presumed that the side face 50 and the side face 59 are substantially vertical to each other. Thus, the rotation angle of the substrate 5 can be obtained from the side face positions 55 and 56 only. However, in order to ensure precision, an angle is obtained similarly with respect to the side face positions 57 and 58, and the rotation angle of the substrate 5 is defined by using an average of both of the above obtained angles.

Since a distance of the position of center of gravity is predetermined from the side face positions, the position of center of gravity can be easily obtained by a distance derived from the inclination when inclination of the side face 50 or 59 (rotation angle of substrate 5) is found.

Figure 6:
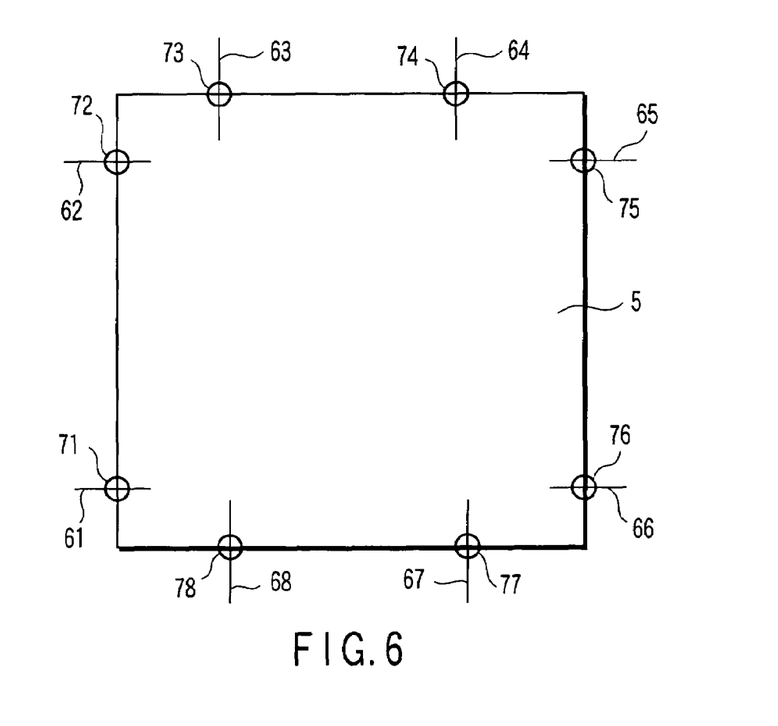
FIG. 6 is a view for explaining another method for detecting a position of center of gravity and a rotation angle of the substrate according to the embodiment.

FIG. 6 is a view for explaining another example of the method for acquiring the position of center of gravity and rotation angle of the substrate 5.

In this example, it is presumed that the size of the substrate 5 changes (in the crossing range). In the case of FIG. 5, calculation is carried out using the position of center of gravity from the side faces 50 and 59 (reference faces) of the substrate 5. Thus, it has been sufficient if the adjacent two side faces of the four side faces are measured. However, in the case of FIG. 6, it is presumed that the size of the substrate changes, and therefore, the previously described processing (acquisition of the side face position) is carried out with respect to all of the side faces.

Concretely, as shown in FIG. 6, the side face position acquiring process described previously is carried out with respect to scanning lines 61, 62, 63, 64, 65, 66, 67, and 68, thereby obtaining side face positions 71, 72, 73, 74, 75, 76, 77, and 78.

Next, the length of one edge is obtained by using the side face positions 71, 72, 75, and 76 in order to obtain the size of the substrate 5 (the length of one edge of the substrate 5 in the transverse direction in FIG. 5), and inclination of these side faces is calculated. The length and inclination of the side face in the transverse direction can be obtained by the side face positions 71 and 76 only. However, in order to ensure precision, the length and inclination of the side face in the transverse direction obtained from the side face positions 72 and 75 are obtained, and then, the length and inclination of the side face of the substrate 5 in the transverse direction are obtained by using an average of both of them.

Next, in order to obtain the size of the substrate 5 (length of one edge of the substrate 5 in the longitudinal direction in FIG. 5), similar processing operation is carried out by using the remaining side face positions 73, 74, 77, and 78. In this manner, the size of the substrate 5 (lengths of edges of substrate 5 in the transverse and longitudinal directions) is determined, and a rotation angle is also defined. Then, a position of center of gravity is calculated by using these items of information.

Figure 7:
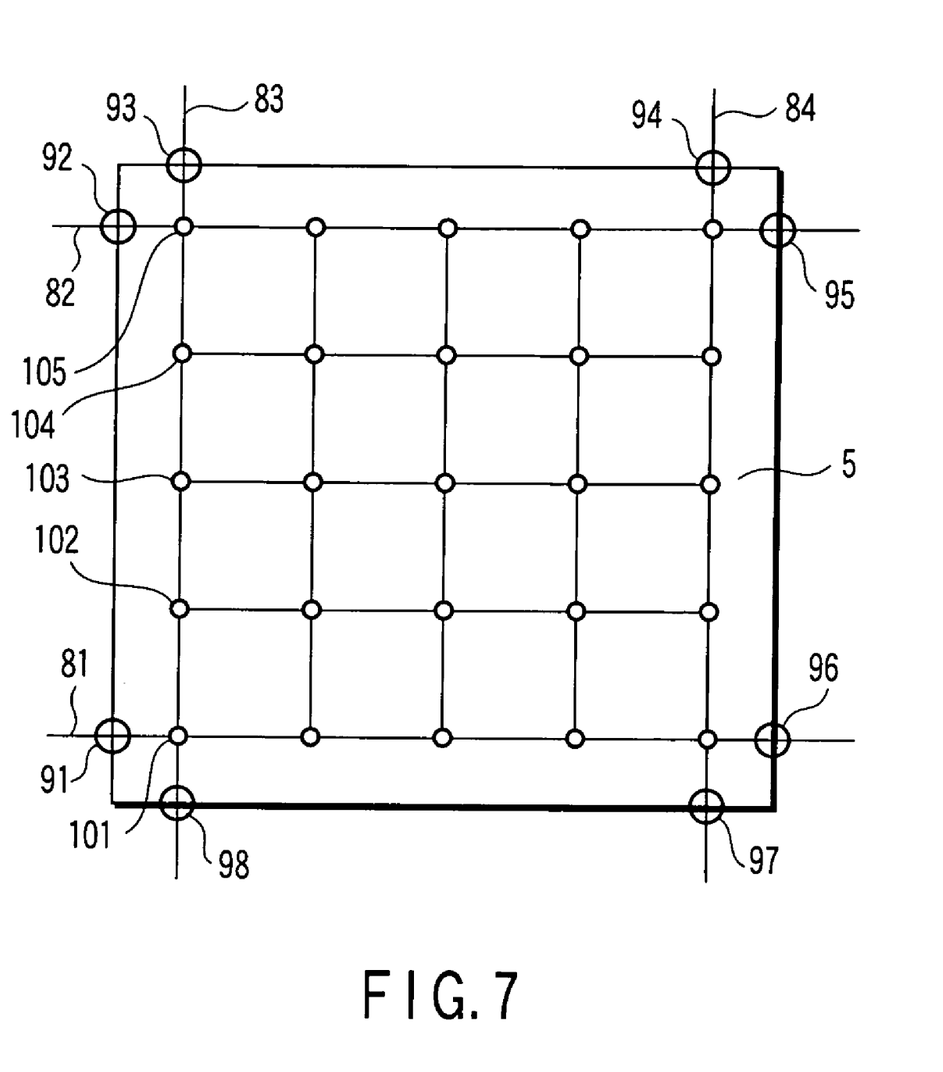
FIG. 7 is a view for explaining a substrate height detecting method by applying the method for detecting the position of center of gravity and rotation angle of the substrate shown in FIG. 6.

FIG. 7 is a view for explaining a method for measuring the height of the substrate 5 by applying the method for acquiring the position of center of gravity and rotation angle of the substrate shown in FIG. 6. In this method, the size, position of center of gravity, and rotation angle of the substrate 5 are determined, and at the same time, the height distribution of the surface of the substrate 5 is measured. According to this method, the height distribution of the substrate 5 can be efficiently measured. Even in the case where the position of the substrate 5 is corrected, the slackness shape of the substrate 5 does not substantially change, and thus, this method can be sufficiently applied. In addition, this method is suitable when re-measurement is carried out in order to make a check after the position of the substrate 5 has been corrected once. In this manner, time required for height measurement can be reduced.

In the above described method, a scanning line of a stage for acquiring the side face position shown in FIG. 6 is extended, and measurement is carried out to the side face of the opposite side. For example, in the case of a scanning line 83, measurement is started from the outside of the side face, and a point at which the Z sensor value exceeds a threshold value on the side face is defined as an side face position 98. Thereafter, a stage operation is continued as is, measurement points 101, 102, 103, 104, and 105 set in the lattice shape on the substrate 5 are measured, and the position of the opposite side face position 93 is acquired. A similar processing operation is carried out with respect to scanning lines 81, 82, and 84, thereafter, the height of the remaining lattice point is measured. In this manner, effective measurement can be carried out.

Next, a description will be given with respect to a method for carrying out drawing without impairing drawing precision after information on the position of center of gravity and rotation angle of the substrate 5 is acquired by any of the above described methods.

First, with reference to FIG. 1 again, a description will be given with respect to a method for correcting the drawing pattern by using information on the position of center of gravity and rotation angle of the substrate 5.

In the drawing apparatus shown in FIG. 1, a position of center of gravity shift and rotation angle shift on the stage 3 of the substrate 5 is measured, and the information is stored in the entire control unit 20. The drawing position information on a pattern to be drawn on the substrate is changed based on the stored information.

Concretely, changing a pattern causes data conversion, therefore, when a drawing pattern is generated by the pattern generating unit 23, the drawing position is corrected by applying coordinate conversion in consideration of the position of center of gravity shift or the rotation angle shift. The drawing data is sent to the deflection control unit 29, and drawing is carried out on the corrected position. In this manner, even in the case where the position of center of gravity shift or the rotation angle shift exists on the substrate 5 on the stage 3, it becomes possible to carry out drawing with high precision without transporting the substrate 5 again.

When the rotation angle shift is large, there is a case in which rotation of the entire drawing data as well as parallel translation of drawing data must be carried out. Accordingly, this method is not suitable in the case where the rotation angle shift is so large.

When a large rotation shift exists, it is necessary to reinstall a mask by the transport system. The above method will be described with reference to FIG. 2.

In FIG. 2, it is assumed that the position of center of gravity shift or the rotation angle shift exists on the substrate 5 mounted on the stage 3. Although it is possible to provide a correcting mechanism on the stage 3, such provision is not so realistic because the mechanism becomes complicated, and a vibration or particles can occur.

Thus, the substrate 5 is temporarily transported from the inside of the sample chamber 2 by means of the transport robot 15, the setup position and setup angle of the substrate 5 are adjusted in the preparatory chamber 14, and the position of center of gravity and rotation angle of the substrate 5 on the stage 3 are corrected. The position of center of gravity of the substrate 5 on the stage 3 is corrected by the transport robot 15, and the rotation angle of the substrate 5 on the stage 3 is corrected by a well known rotating mechanism 32 provided in the preparatory chamber 14.

In this manner, the position of center of gravity and rotation angle of the substrate 5 on the stage 3 are corrected in the preparatory chamber 14, the substrate 5 having corrected the position of center of gravity and rotation angle is transported into the sample chamber by the transport robot 15, and further, the substrate 5 is mounted again on the stage 3, whereby the position of center of gravity and rotation angle of the substrate 5 on the stage 3 are corrected. Thereafter, it is also effective to measure the position of center of gravity and rotation angle of the substrate 5 again by using the stage 3 and the Z sensor (not shown), and then, check correction. At this time, it is better to measure the height of the surface of the substrate 5 in accordance with the previous method shown in FIG. 7.

As has been described above, according to the present embodiment, while the height of the substrate 5 is measured by the substrate height detecting mechanism (Z sensor) for measuring the height of the surface of the substrate 5, the stage 3 is moved, and the height change of the side face of the substrate 5 is acquired, so that it becomes possible to know the coordinate of the substrate side face. By carrying out this operation at a plurality of points, information such as the size of the substrate 5, the setup position and rotation angle of the substrate 5 on the stage 3 can be acquired. There can be provided a drawing apparatus in which, using these items of information, a pattern to be drawn is corrected on the substrate 5 or the setup position of the substrate 5 is corrected by the transport robot 15 or the like, so that it becomes possible to reduce a position shift on the substrate of the pattern to be drawn on the substrate 5.

Further, the Z sensor is provided beforehand in order to measure (detect) the height of the substrate 5, in the present embodiment, the substrate side face is acquired by utilizing the Z sensor, and the position of center of gravity and rotation angle of the substrate 5 are obtained based on the acquired substrate side face. Therefore, it is possible to suppress the position shift on the substrate 5 of the pattern to be drawn on the substrate 5 without causing apparatus to be complicated.

The present invention is not limited to the above described embodiment. For example, while the above embodiment has described a case of using an electron beam as a charged particle beam, the present invention can be applied to a correcting machine (charged particle beam correcting apparatus) for correcting a defect on a substrate surface by using a convergent ion beam.

While the above embodiment has described a case of detecting the height of the substrate on the stage 3 based on the incidence position of the laser beam 10 on the light receiving unit 13, the height of the substrate on the stage 3 may be detected based on the intensity of the laser beam reflected from the substrate 5.

In addition, while the above embodiment has described a case in which the entire control unit 20 plays a role as calculating unit, the stage control unit 25 or the Z sensor processing unit 28 may play a role as calculating unit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam processing apparatus comprising:
    a sample chamber configured to process a substrate including a plurality of side faces by a charged particle beam;
    a movable stage provided in the sample chamber, the movable stage including a place on which the substrate is to be mounted;
    a height and position acquiring unit configured to acquire a height of the substrate on the movable stage by irradiating a laser beam onto the substrate mounted on the movable stage while moving the movable stage on which the substrate is mounted and using the laser beam reflected from the substrate and configured to acquire positions of at least two adjacent side faces among the plurality of side faces of the substrate mounted on the movable stage based on the acquired height of the substrate;
    a calculating unit configured to calculate a position of center of gravity of the substrate mounted on the movable stage and a rotation angle as to a rotary axis vertical to the place on which the substrate is to be mounted based on the positions of the at least two adjacent side faces; and
    a correcting unit configured to correct the position of center of gravity of the substrate on the movable stage and the rotation angle based on the position of center of gravity and the rotation angle calculated by the calculating unit,
    wherein the correcting unit corrects the position of center of gravity and the rotation angle on the substrate outside the sample chamber.

2. The charged particle beam processing apparatus according to claim 1, further comprising: a preparatory chamber to temporarily contain the substrate, and wherein the correcting unit corrects the position of center of gravity of the substrate and the rotation angle inside the sample chamber.

3. The charged particle beam processing apparatus according to claim 2, further comprising: a transport chamber to transport the substrate, and wherein the preparatory chamber is connected to the sample chamber via the transport chamber.

4. The charged particle beam processing apparatus according to claim 3, wherein the correcting unit comprises a transport robot configured to correct the position of center of gravity of the substrate inside the preparatory chamber and perform transportation of the substrate between the sample chamber and the transport chamber and transportation of the substrate between the transport chamber and the preparatory chamber; and a rotating mechanism provided in the preparatory chamber and configured to correct the rotation angle of the substrate.

5. The charged particle beam processing apparatus according to claim 2, wherein the correcting unit comprises a transport robot configured to correct the position of center of gravity of the substrate inside the preparatory chamber; and a rotating mechanism provided in the preparatory chamber configured to correct the rotation angle of the substrate.

6. The charged particle beam processing apparatus according to claim 1, wherein the correcting unit comprises a transport robot configured to correct the position of center of gravity of the substrate and a rotating mechanism configured to correct the rotation angle of the substrate.

7. The charged particle beam processing apparatus according to claim 1, wherein the changed particle beam is an electron beam.

8. The charged particle beam processing apparatus according to claim 1, wherein the charged particle beam is a convergent ion beam.

* * * * *